United States Patent
Lai

(10) Patent No.: US 6,548,385 B1
(45) Date of Patent: Apr. 15, 2003

(54) METHOD FOR REDUCING PITCH BETWEEN CONDUCTIVE FEATURES, AND STRUCTURE FORMED USING THE METHOD

(76) Inventor: Jiun-Ren Lai, 16 Li-Hsin Rd., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 10/170,285

(22) Filed: Jun. 12, 2002

(51) Int. Cl.$^7$ .......................... H01L 21/22; H01L 21/38
(52) U.S. Cl. ........................................ 438/552; 438/448
(58) Field of Search ................................. 438/266, 311, 438/431, 448, 475, 552, 636, 673, 674, 680, 695, 758, 770, 781, 782

(56) References Cited

U.S. PATENT DOCUMENTS 4,441,791 A * 4/1984 Hornbeck ................... 350/360
6,136,652 A * 10/2000 Hazani ....................... 438/260

* cited by examiner

Primary Examiner—David Nelms
Assistant Examiner—David Nhu
(74) Attorney, Agent, or Firm—Stout, Uxa, Buyan & Mullins, LLP.

(57) ABSTRACT

A method is described which may be used to reduce a pitch between conductive features. One embodiment of the method involves forming a structure including a substrate, a conductive layer on the substrate, multiple photoresist features arranged on the conductive layer, a polymer layer on top surfaces and sidewalls of each of the photoresist features, and a material layer on and around the photoresist features and the polymer layers. An upper portion of the material layer is removed such that upper surfaces of the photoresist features and the polymer layer are exposed, and a remaining portion of the material layer remains. The polymer layer is removed, and the photoresist features and the remaining portion of the material layer are used as etch masks to pattern the conductive layer, thereby producing a number of conductive features. The photoresist features and the remaining portion of the material layer are removed.

20 Claims, 5 Drawing Sheets

METHOD FOR REDUCING PITCH BETWEEN CONDUCTIVE FEATURES, AND STRUCTURE FORMED USING THE METHOD

BACKGROUND OF THE INVENTION

1. Field of the Invention

The present invention relates generally to semiconductor fabrication, and more particularly to semiconductor fabrication methods for reducing spacing dimensions or pitch between features.

2. Description of Related Art

Integrated circuits are in wide use today. A typical integrated circuit includes electronic devices electrically connected by conductive interconnect lines (i.e., interconnects). Interconnects are typically patterned from conductive layers formed on or above the surface of a semiconductor wafer. One or more conductive layers may be patterned to form one or more levels of interconnects, spaced from each other by one or more interlevel dielectric structures.

Integrated circuits including metal oxide semiconductor (MOS) transistors can offer performance advantages over circuits including other types of active electronic devices (e.g., bipolar transistors) in many applications. MOS transistors are formed in and on semiconductor wafers, and typically within defined active regions of major wafer surfaces.

In integrated circuits formed on silicon wafers, polycrystalline silicon (i.e., polysilicon) is commonly used to form interconnects, including gate electrodes of MOS transistors. The use of polysilicon to form the gate electrodes of MOS transistors allows source and drain regions of the MOS transistors to be precisely defined in for example a self-aligned process. In the self-aligned process, overlaps between the gate electrodes and source and drain regions can be minimized, improving MOS transistor (and circuit) performance.

When polysilicon is used to form gate electrodes in MOS transistors, undoped polysilicon is typically deposited on a gate insulator layer. The gate insulator layer is typically silicon dioxide ($SiO_2$); thus the gate insulator layer is commonly referred to as a gate oxide layer.

In a typical self-aligned process, a thin, highly controlled layer of silicon dioxide (i.e., oxide) is grown on exposed surfaces of a silicon wafer in defined active areas of the silicon wafer. Polysilicon is deposited over the entire semiconductor wafer, and patterned to form desired interconnect features, including gate electrodes. Portions of the gate oxide not covered by the polysilicon features are etched away, and the silicon wafer is exposed to a dopant source. As a result, dopant atoms are implanted in the silicon wafer (i.e., substrate), forming diffusion junctions in the substrate. The diffusion junctions form the source and drain regions of MOS transistors. Dopant atoms are also implanted in the polysilicon features (i.e., the polysilicon features are also doped). The doping of the polysilicon features reduces the resistivity of the polysilicon features, increasing the electrical conductivity of the polysilicon features.

In the above described self-aligned process, the drain and source regions are formed only in regions of the substrate not covered by the polysilicon gate electrode features. The source and drain regions do not extend under the polysilicon gate electrodes. The gate/source/drain overlaps are minimized, and MOS transistor (and circuit) performance can be improved.

Integrated circuit features are typically formed by patterning sheets or layers of desired materials via a lithographic process (e.g., photolithography). During lithographic processes, undesired portions of layers of desired materials are removed (e.g., via etching). The remaining desired portions define features including the desired materials.

In integrated circuits, as in circuits in general, conductive features (e.g., interconnects) must be isolated from one another to prevent electrical contact, and to reduce electrical capacitance and signal cross talk. The term "pitch" is commonly used to refer to a distance between a reference point (e.g., an edge, a center point, etc.) of a feature, and a corresponding point of an adjacent, similar feature. In general, pitches which achieve acceptable levels of performance are specified during design of an integrated circuit, and maintained during fabrication of the integrated circuit.

Integrated circuits are generally categorized by critical dimensions (i.e., sizes) of electronic devices, and/or densities of electronic devices per unit area (i.e., levels of device integration). In order to obtain higher levels of performance, the trend in the semiconductor fabrication is toward smaller electronic devices and denser integrated circuits (i.e., higher levels of device integration). Making integrated circuits denser necessarily entails reducing pitches between conductive features. Limits of lithographic processes used to form features typically determine critical dimensions (i.e., sizes) of electronic devices, as well as minimum spacing distances between the features. In general, integrated circuit features, including conductive features, are typically arranged as close to one another as the limits of the lithographic process used to form the features will permit.

In order to increase the density of electronic devices per unit area (i.e., achieve higher levels of device integration), an ongoing need exists to reduce spacing distances between adjacent features of integrated circuits, and pitches between conductive features.

SUMMARY OF THE INVENTION

A method is described which may be used to reduce a pitch between conductive features. One embodiment of the method involves forming a structure including a substrate, a conductive layer on the substrate, multiple photoresist features arranged on the conductive layer, a polymer layer on sidewalls of each of the photoresist features, and a material layer on and around the photoresist features and the polymer layers. An upper portion of the material layer is removed such that upper surfaces of the photoresist features and the polymer layers are exposed, and a remaining portion of the material layer remains. The polymer layers are removed, and the photoresist features and the remaining portion of the material layer are used as etch masks to pattern the conductive layer, thereby producing a plurality of conductive features. The photoresist features and the remaining portion of the material layer can then be removed.

The material layer may be formed from a material that is volatilized at a temperature greater than a temperature at which a polymer material making up the polymer layers is volatilized. Further, the photoresist layer may be formed from a resist material that is volatilized at a temperature greater than a temperature at which a polymer material making up the polymer layers is volatilized. In this situation, the polymer material making up the polymer layers may be removed by volatilizing it in an ashing chamber at a temperature low enough that the remaining portion of the material layer and the photoresist features are substantially unaffected. In addition to sidewalls, the polymer layer can be also be formed on top surfaces of the photoresist features.

In situations where the photoresist features are formed using a photolithographic process, and the pitch of the photoresist features is as small as the photolithographic process will allow, the conductive features produced using the above method may be approximately half of the pitch of the photoresist features. The resulting decrease in the pitch between conductive features allows more electronic devices per unit area of semiconductor substrate (i.e., higher levels of device integration).

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
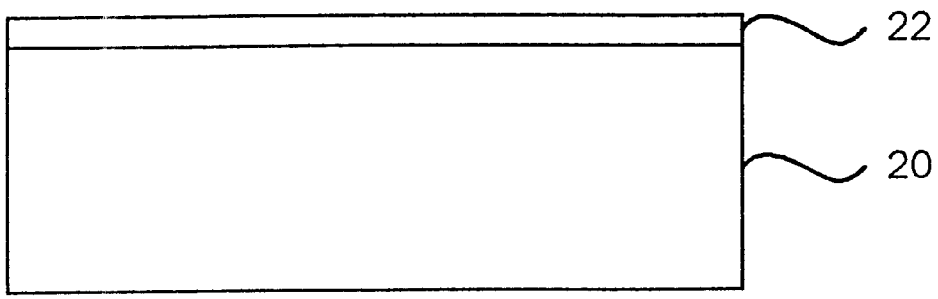
FIG. 1 is a cross-sectional view of a semiconductor substrate having a silicon dioxide (i.e., oxide) layer formed on a surface of the substrate.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form, and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process, procedures and structures described herein do not cover all operations required to form an integrated circuit. The present invention may be practiced in conjunction with various techniques conventionally used in the art, and only so much of the commonly practiced process steps are included herein as are necessary to provide an understanding of the present invention.

Referring more particularly to the drawings, FIGS. 1–11 are used to describe an embodiment of a method for reducing a pitch between adjacent conductive features. FIG. 1 is a cross-sectional view of a semiconductor substrate 20 having a silicon dioxide (i.e., oxide) layer 22 formed on an upper surface of the substrate 20. The semiconductor substrate 20 may be, for example, a semiconductor wafer (e.g., a silicon wafer). The oxide layer 22 consists substantially of silicon dioxide ($SiO_2$), and may be, for example, a gate oxide layer. Where the oxide layer 22 is a gate oxide layer, the oxide layer 22 may be grown on the upper surface of the substrate 20 using a dry oxidation process. During the dry oxidation process, the substrate 20 may be heated in an oxygen-rich atmosphere.

Figure 2:
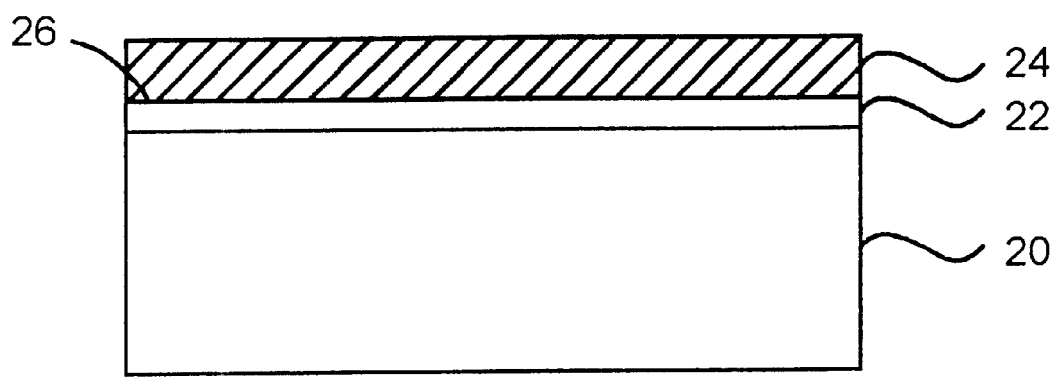
FIG. 2 is a cross-sectional view of FIG. 1, wherein an electrically conductive (i.e., conductive) layer has been formed on the oxide layer.

FIG. 2 is a cross-sectional view of FIG. 1, wherein an electrically conductive (i.e., conductive) layer 24 has been formed on an upper surface 26 of the oxide layer 22. It is noted that an underside surface of the oxide layer 22, opposite the upper surface 26, is in contact with the substrate 20. The conductive layer 24 may, for example, consist substantially of polycrystalline silicon (i.e., polysilicon).

Where the conductive layer 24 is formed from polysilicon, the polysilicon may be, for example, deposited on the upper surface 26 of the oxide layer 22 using a chemical vapor deposition (CVD) process. The polysilicon is preferably doped to increase its electrical conductivity. During the doping, dopant atoms (e.g., phosphorus) may be introduced into the polysilicon. The doping may be carried out via a subsequent diffusion process or ion implantation process. It is also possible to dope the polysilicon in-situ during the above described CVD process.

Figure 3:
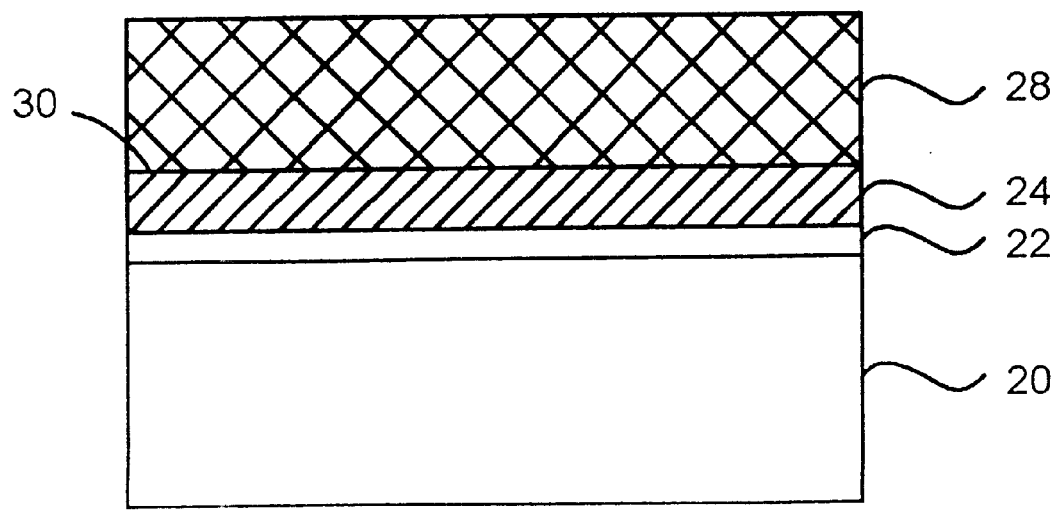
FIG. 3 is a cross-sectional view of FIG. 2, wherein a photoresist layer has been formed on the conductive layer.

FIG. 3 is a cross-sectional view of FIG. 2, wherein a photoresist layer 28 has been formed on an upper surface 30 of the conductive layer 24. The photoresist layer 28 may be formed, for example, from a negative resist material wherein a portion of the photoresist layer 28 exposed to light is polymerized, and therefore less soluble. Alternately, the photoresist layer 28 may be formed from a positive resist material, wherein a portion of the photoresist layer 28 exposed to light becomes more soluble.

Figure 4:
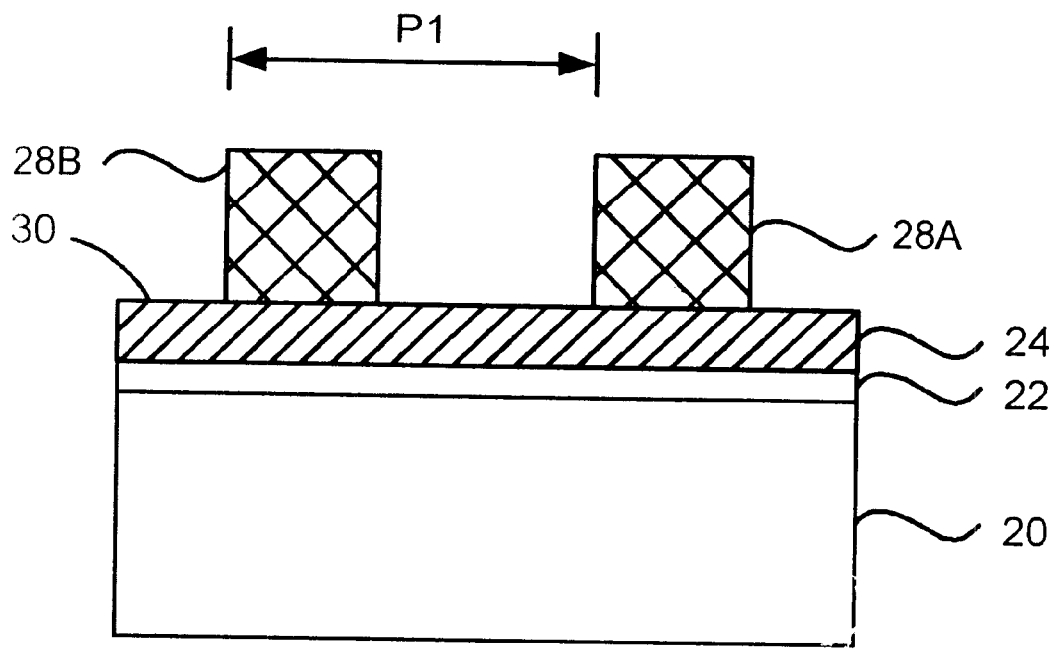
FIG. 4 is a cross-sectional view of FIG. 3, following a patterning of the photoresist layer, wherein two photoresist features remain on the conductive layer.

FIG. 4 is a cross-sectional view of FIG. 3 following a photolithographic process, wherein a portion of the photoresist layer 28 has been removed, leaving two photoresist features 28A and 28B on the upper surface 30 of the conductive layer 24, and exposing a portion of the upper surface 30 of the conductive layer 24 surrounding the photoresist features 28A and 28B. During the photolithographic process, a portion of the photoresist layer 28 is exposed to light, expectedly making the removed portion of the photoresist layer 28 more soluble. The more soluble removed portion may be, for example, dissolved in a solvent, and flushed away, leaving the two photoresist features 28A and 28B on the upper surface 30 of the conductive layer 24.

In FIG. 4, a pitch of the photoresist features 28A and 28B is labeled "P1." It is noted that pitch P1 is preferably as small as the photolithographic process used to pattern the photoresist layer 28, thereby forming the photoresist features 28A and 28B, will allow.

Figure 5:
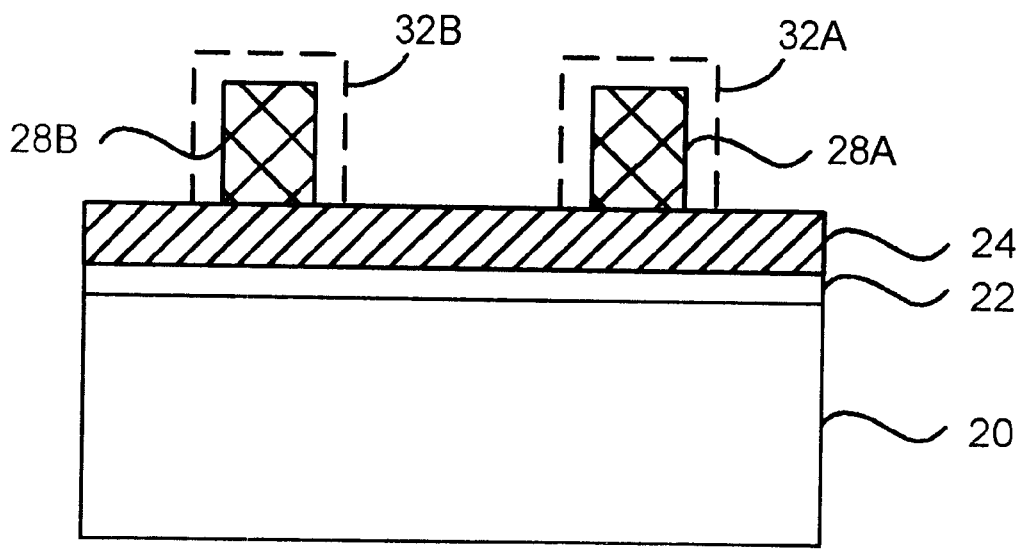
FIG. 5 is a cross-sectional view of FIG. 4, following a trimming operation performed on the photoresist features, wherein exposed portions of the photoresist features are removed.

FIG. 5 is a cross-sectional view of FIG. 4, following a trimming operation performed on the photoresist features 28A and 28B, wherein exposed portions 32A and 32B of the respective photoresist features 28A and 28B are removed. As indicted in FIG. 5, the exposed portions 32A and 32B include sidewalls, and upper surfaces, of the photoresist features 28A and 28B. Such a trimming operation can be carried out using a dry etch process, which can be performed, for example, in a chamber of a high-density plasma (HDP) etcher tool, and which can involve the introduction of oxygen ($O_2$) and hydrogen bromide (HBr) gases into the chamber.

Figure 6:
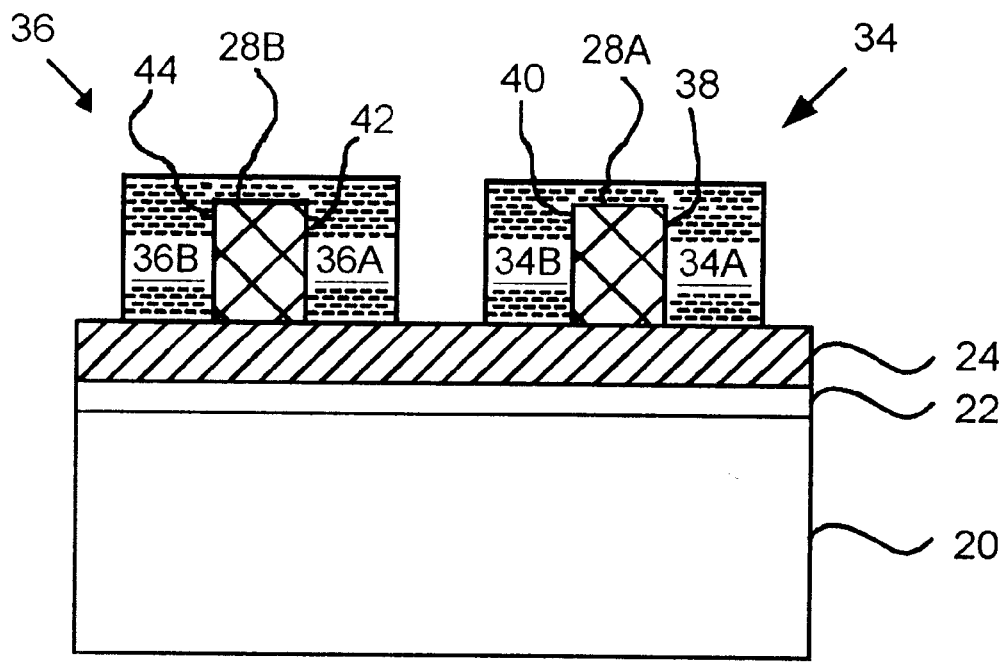
FIG. 6 is a cross-sectional view of FIG. 5, following the forming of a polymer layer on top surfaces and sidewalls of each of the photoresist features.

FIG. 6 is a cross-sectional view of FIG. 5, following the forming of polymer layers on the top surfaces and the sidewalls of the photoresist features 28A and 28B. A first polymer layer 34 is formed on the top surfaces and the sidewalls of the photoresist feature 28A, and a second polymer layer 36 is formed on the top surfaces and the sidewalls of the photoresist feature 28B.

In FIG. 6, a portion 34A of the first polymer layer 34 is in contact with a right-hand sidewall 38 of the photoresist feature 28A, and a portion 34B of the first polymer layer 34 is in contact with a left-hand sidewall 40 of the photoresist feature 28A. Similarly, a portion 36A of the second polymer layer 36 is in contact with a right-hand sidewall 42 of the photoresist feature 28B, and a portion 36B of the second polymer layer 36 is in contact with a left-hand sidewall 44 of the photoresist feature 28B.

The polymer layers 34 and 36 may be formed using a dielectric resolution enhancement coating technique performed in an etcher. The polymer layers 34 and 36 can be formed using, for example, in whole or in part, the methods and apparatus disclosed in co-pending U.S. Application Ser. No. 09/978,546, the contents of which are incorporated herein by reference. Regarding formation of the polymer layers 34 and 36, an etcher can be utilized in combination with a recipe for controlling the deposition/etching ratio in reaction so as to form the polymer layers 34 and 36 on the side walls and/or top surfaces of the photoresist features. The reactive gas used in the reaction is preferably one unable to react with the underlayer such as the conductive layer 24. In the illustrated embodiment, the polymer layers 34 and 36 are formed using $CH_2F_2$ and $C_4F_8$ gas in a dual plasma etcher.

Figure 7:
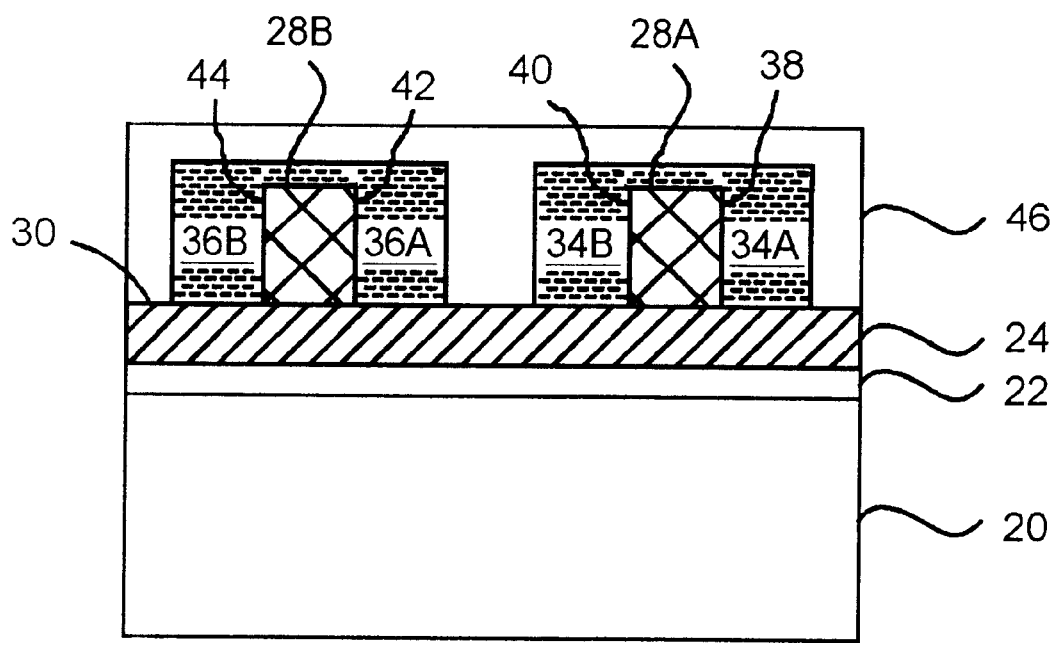
FIG. 7 is a cross-sectional view of FIG. 6, following the forming of a material layer over and around the photoresist features and the polymer layers.

FIG. 7 is a cross-sectional view of FIG. 6, following the formation of a material layer 46 over and around the photoresist features 28A and 28B and the polymer layers 34 and 36. As indicated in FIG. 7, the material layer 46 is also in contact with exposed portions of the upper surface 30 of the conductive layer 24, which extends beneath the photoresist features 28A and 28B and the polymer layers 34 and 36.

In general, the material used to form the material layer 46 has the property such that it can be volatilized at a temperature greater than that of a polymer material making up the polymer layers 34 and 36. The material used to form the material layer 46 may, for example, have a density greater than a density of the polymer material, as denser materials tend to volatilize at higher temperatures. In addition, the resist material used to form the photoresist layer 28 (FIG. 3), and from which the photoresist features 28A and 28B are formed, is also volatilized at a temperature greater than that of the polymer material making up the polymer layers 34 and 36. The resist material may also have a density greater than the density of the polymer material.

An ashing process is commonly used to remove organic substances (e.g., photoresists) from surfaces by heating the surfaces in an oxidizing gaseous atmosphere. During the ashing process, the organic substances are oxidized, and removed via volatilization. In a subsequent ashing process described below, the polymer material making up the polymer layers 34 and 36 is volatilized in an ashing chamber at a temperature low enough that a remaining portion of the material layer 46, and the photoresist features 28A and 28B, are substantially unaffected.

Known materials that volatilize at temperatures greater than that of the polymer material making up the polymer layers 34 and 36, and that may be used to form the material layer 46, include widely available bottom anti-reflective coating (BARC) materials, and spin-on-glass (SOG) materials.

Figure 8:
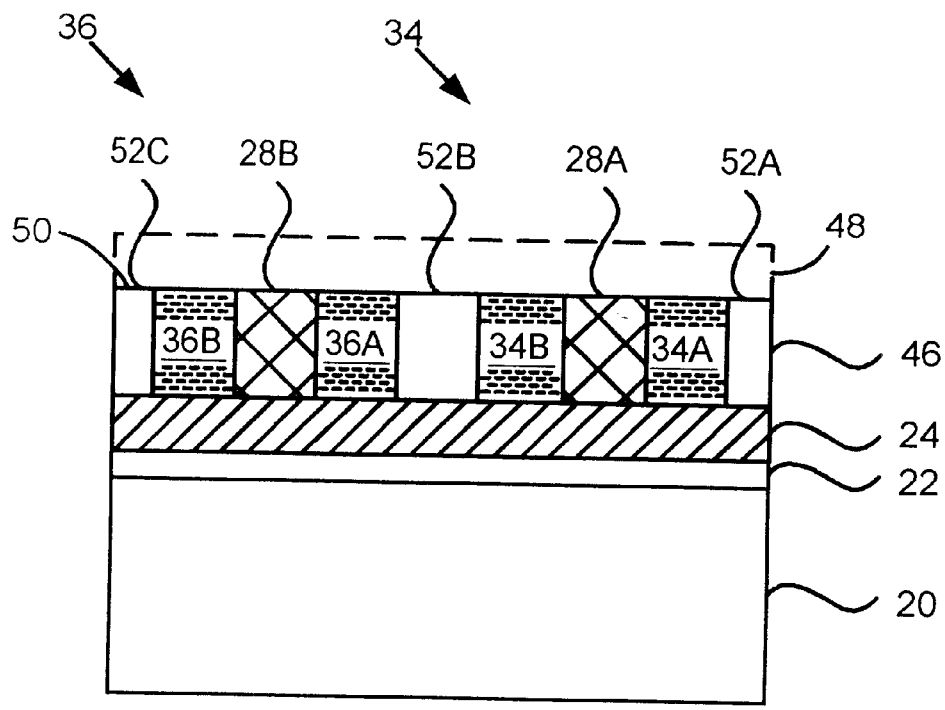
FIG. 8 is a cross-sectional view of FIG. 7, following an operation during which an upper portion of the material layer is removed such that an upper surface of the material layer is even with (i.e., flush with) upper surfaces of the polymer layers and the photoresist features.

FIG. 8 is a cross-sectional view of FIG. 7, following an operation during which an upper portion 48 of the material layer 46 is removed such that an upper surface 50 of the material layer 46 is even with (i.e., flush with) upper surfaces of the polymer layers 34 and 36 and the photoresist features 28A and 28B. As a result, the upper surfaces of the polymer layers 34 and 36, and the upper surfaces of the photoresist features 28A and 28B, are exposed through the upper surface 50 of the material layer 46. Remaining portions 52A–52C of the material layer 46 following the removal operation are indicated in FIG. 8. The removing of the upper portion 48 of the material layer 46 may be carried out via an chemical etch process, a mechanical polishing process, or a chemical-mechanical polishing (CMP) process.

Figure 9:
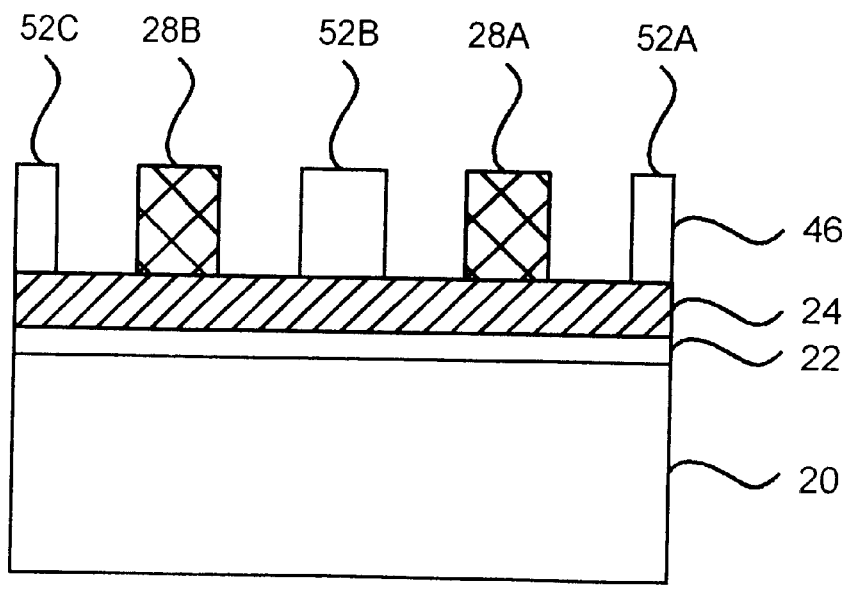
FIG. 9 is a cross-sectional view of FIG. 8, following an ashing process, during which the polymer layers are removed at a temperature low enough that remaining portions of the material layer, and the photoresist features, are substantially unaffected.

FIG. 9 is a cross-sectional view of FIG. 8, following an ashing process, during which the polymer layers 34 and 36 are removed at a temperature low enough that the remaining portions 52A–52C of the material layer 46, and the photoresist features 28A and 28B, are substantially unaffected. For example, during the ashing process, the polymer material making up the polymer layers 34 and 36, which were formed using $CH_2F_2$ and $C_4F_8$ gas in a dual plasma etcher, may be volatilized in an ashing chamber at a relatively low temperature of about 100 to about 150 degrees Celsius.

As shown in FIG. 9, the photoresist features 28A and 28B, and the remaining portions 52A–52C of the material layer 46, remain spaced apart on the conductive layer 24 following the ashing process.

Figure 10:
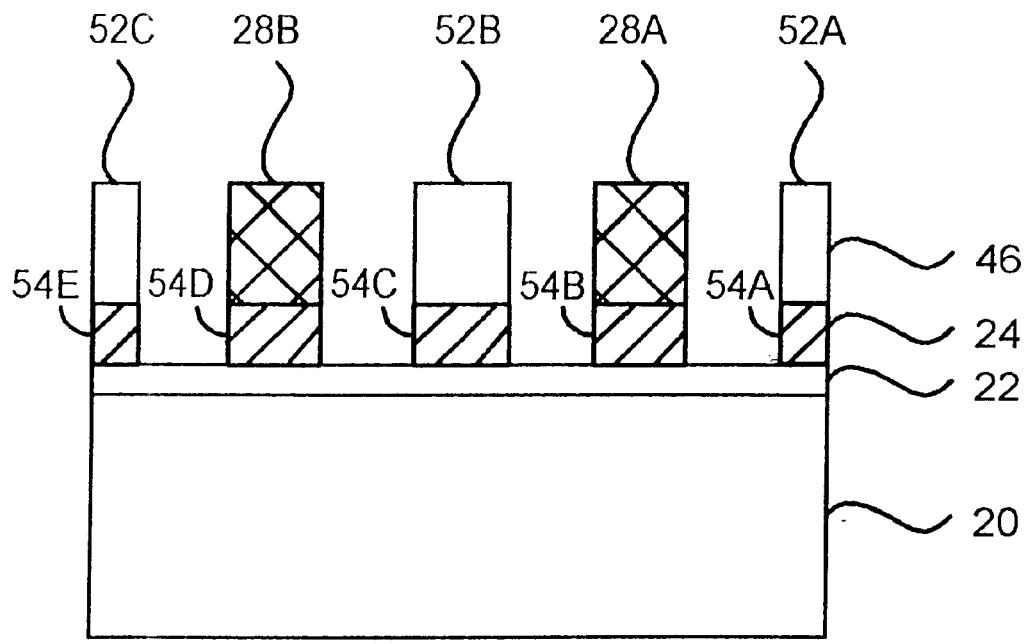
FIG. 10 is a cross-sectional view of FIG. 9, following an etching operation during which the photoresist features and the remaining portions of the material layer are used as an etching mask to pattern the conductive layer, thereby forming multiple conductive features on the oxide layer.

FIG. 10 is a cross-sectional view of FIG. 9, following an etching operation during which the photoresist features 28A and 28B and the remaining portions 52A–52C of the material layer 46 are used as etching masks to pattern the conductive layer 24, thereby forming multiple conductive features 54A–54E on the oxide layer 22. The etching operation may be, for example, a dry plasma etch process. The etch process is preferably a selective etch process in which the selectivity of the material making up the conductive layer 24 (e.g., polysilicon) to oxide ($SiO_2$) is relatively high. That is, portions of the conductive layer 24 not protected by the photoresist features 28A and 28B and the remaining portions 52A–52C of the material layer 46 are substantially removed, while the oxide layer 22 beneath the conductive layer 24 is preferably substantially unaffected.

Figure 11:
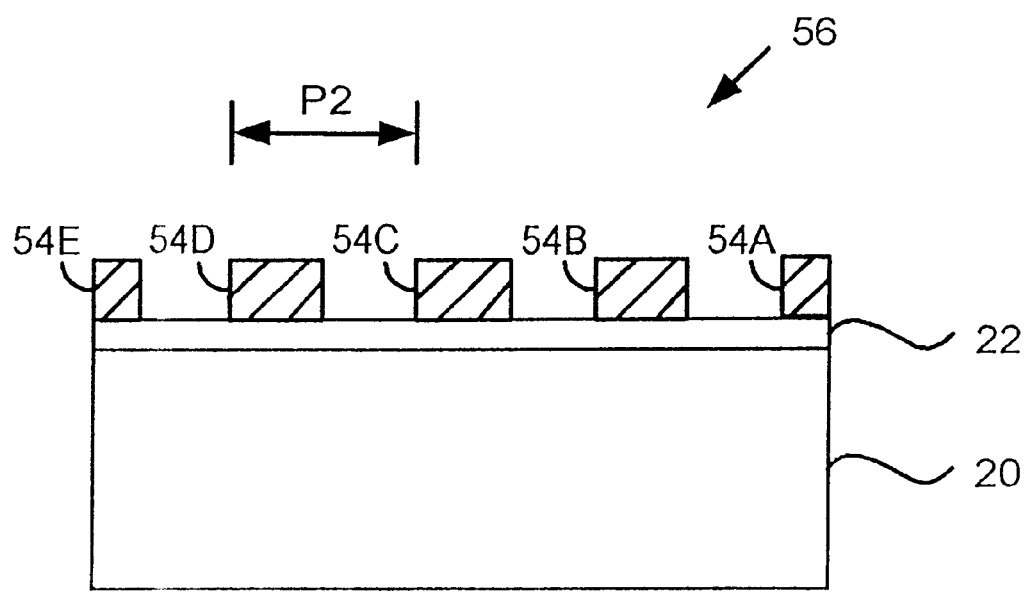
FIG. 11 is a cross-sectional view of FIG. 10, following removal of the photoresist features and the remaining portions of the material layer, leaving the conductive features on the oxide layer.

FIG. 11 is a cross-sectional view of FIG. 10, following removal of the photoresist features 28A and 28B and the remaining portions 52A–52C of the material layer 46. A resulting semiconductor structure 56 includes the conductive features 54A–54E on the oxide layer 22, wherein the oxide layer 22 is on the substrate 20. The conductive features 54A–54E may be, for example, used as gate electrodes of metal oxide semiconductor (MOS) transistors.

Where the material layer 46 is a BARC layer, the photoresist features 28A and 28B and the remaining portions 52A–52C of the material layer 46 may be removed simultaneously (e.g., during a single ashing process). Where the material layer 46 is a SOG layer, the photoresist features 28A and 28B and the remaining portions 52A–52C of the material layer 46 may be removed via separate processes (e.g., a dry plasma etch process to remove the remaining portions 52A–52C of the material layer 46, and an ashing process to remove the photoresist features 28A and 28B).

In FIG. 11, a pitch of the conductive features 54A–54E is labeled "P2." It is noted that pitch P2 is approximately half of the pitch P1 of the photoresist features 28A and 28B in FIG. 4. As described above, the pitch P1 is preferably as small as the photolithographic process, used to pattern the photoresist layer 28 into photoresist features 28A and 28B, will allow. In this situation, pitch P2 is approximately half of the smallest pitch the photolithographic process will allow. The resulting decrease in the pitch between conductive features (e.g., conductive features 54A–54E in FIG. 11) can allow for more electronic devices per unit area of semiconductor substrate (i.e., higher levels of device integration).

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method, comprising:
   providing a structure comprising a substrate, a conductive layer on the substrate, a plurality of photoresist features arranged on the conductive layer, a polymer layer on sidewalls of each of the photoresist features, and a material layer on and around the polymer layer and photoresist features;
   exposing upper surfaces of the photoresist features such that a remaining portion of the material layer remains;
   removing the polymer layer;
   using the photoresist features and the remaining portion of the material layer as etch masks to pattern the conductive layer, thereby producing a plurality of conductive features; and
   removing the photoresist features and the remaining portion of the material layer.

2. The method of claim 1, wherein the photoresist features have a pitch, and wherein the conductive features have a pitch, and wherein the pitch of the conductive features is approximately half of the pitch of the photoresist features.

3. The method of claim 1, wherein the photoresist features are formed using a photolithographic process, and wherein a pitch of the photoresist features is as small as the photolithographic process will allow.

4. The method of claim 1, wherein the material layer comprises a material that is volatilized at a temperature greater than a temperature at which a polymer material of the polymer layer is volatilized.

5. The method of claim 1, wherein the photoresist layer comprises a material that is volatilized at a temperature greater than a temperature at which a polymer material of the polymer layer is volatilized.

6. The method of claim 1, wherein the material layer comprises a bottom anti-reflective coating (BARC) material, or a spin-on glass (SOG) material.

7. The method of claim 1, wherein when the material layer comprises a BARC material, and wherein the removing of the photoresist features and the remaining portion of the material layer can be carried out in a single process.

8. The method of claim 1, wherein the forming of the polymer layer is accomplished using a dielectric resolution enhancement coating technique.

9. The method of claim 8, wherein the forming of the polymer layer is carried out in an etcher.

10. The method of claim 1, wherein:
    the providing of a structure comprises providing a structure having a polymer layer on sidewalls and upper surfaces of each of the photoresist features; and
    the exposing of upper surfaces of the photoresist features comprises removing portions of the material layer from upper surfaces of the photoresist features to thereby expose the upper surfaces of the photoresist features.

11. The method of claim 1, wherein the photoresist features of the structure have been trimmed in an etcher.

12. A structure formed using the method of claim 3.

13. The method of claim 1, wherein the providing of a structure comprises:
    forming the conductive layer on the substrate;
    forming a photoresist layer on the conductive layer;
    patterning the photoresist layer to form the plurality of photoresist features;
    trimming the photoresist features; and
    forming the polymer layer on top surfaces and sidewalls of each of the photoresist features;
    forming the material layer on and around the photoresist features and the polymer layer.

14. The method of claim 13, wherein the photoresist features have a pitch, and wherein the conductive features have a pitch, and wherein the pitch of the conductive features is approximately half of the pitch of the photoresist features.

15. The method of claim 13, wherein the photoresist features are formed using a photolithographic process, and wherein the pitch of the photoresist features is as small as the photolithographic process will allow.

16. The method of claim 13, wherein:
    when the material layer comprises a material that is volatilized at a temperature greater than a temperature at which a polymer material of the polymer layer is volatilized; and
    the photoresist layer comprises a material that is volatilized at a temperature greater than a temperature at which a polymer material of the polymer layer is volatilized.

17. The method of claim 13, wherein the forming of the polymer layer is accomplished using a dielectric resolution enhancement coating technique.

18. The method of claim 13, wherein the trimming of the photoresist features photoresist is carried out in an etcher.

19. The method of claim 13, wherein trimming of the photoresist features photoresist is carried out in an atmosphere comprising oxygen ($O_2$) gas and hydrogen bromide (HBr) gas.

20. A structure formed using the method of claim 15.

* * * * *